United States Patent [19]
Relph

[11] Patent Number: 5,903,521
[45] Date of Patent: May 11, 1999

[54] FLOATING POINT TIMER

[75] Inventor: Richard A. Relph, Santa Clara, Calif.

[73] Assignee: Advanced Micro Devices, Inc., Sunnyvale, Calif.

[21] Appl. No.: 08/893,702

[22] Filed: Jul. 11, 1997

[51] Int. Cl.⁶ .............................. G04F 8/00; H93H 11/26; H93B 27/00

[52] U.S. Cl. .......................... 368/113; 368/120; 327/277; 331/57

[58] Field of Search ..................... 368/113, 118, 368/120; 327/277–279, 284, 286; 331/57; 364/569

[56] References Cited

U.S. PATENT DOCUMENTS

| | | |
|---|---|---|
| 4,875,201 | 10/1989 | Dalzell ..................................... 368/120 |
| 5,132,572 | 7/1992 | Woo . |
| 5,220,216 | 6/1993 | Woo . |
| 5,227,679 | 7/1993 | Woo . |
| 5,264,745 | 11/1993 | Woo . |
| 5,349,612 | 9/1994 | Guo et al. . |
| 5,363,419 | 11/1994 | Ho . |
| 5,367,542 | 11/1994 | Guo . |
| 5,400,370 | 3/1995 | Guo . |
| 5,452,333 | 9/1995 | Guo et al. . |
| 5,457,336 | 10/1995 | Fang et al. . |
| 5,457,719 | 10/1995 | Guo et al. . |
| 5,465,076 | 11/1995 | Yamauchi et al. ....................... 331/179 |
| 5,684,760 | 11/1997 | Hunter .................................... 368/120 |

*Primary Examiner*—Vit Miska

[57] ABSTRACT

A floating point timer comprises a floating point counter using a reference clock signal generated by a digital ring oscillator having an oscillation period that matches the delay of the worst case path through the floating point counter. The digital ring oscillator utilizes a digital delay line which repeatedly delays a bit for the oscillation period and feedback logic to reapply the delayed bit for another oscillation. The digital delay line includes enough high-precision digital delay elements whereby the oscillation period is at least as great as that of the delay of the worst case path through the floating point counter.

7 Claims, 3 Drawing Sheets

FLOATING POINT TIMER

TECHNICAL FIELD

The present invention relates to digital timers and more particularly to high-resolution floating point timers.

BACKGROUND ART

A floating point timer is a digital circuit that measures an interval of time by counting ticks of a reference clock signal between a start signal and a stop signal. The output of a floating point timer is a set of bits that represents the number of ticks that were counted. Mathematically, numbers can be represented in a scientific notation, $mb^e$, where m represents a mantissa, b a base, and e an exponent. A mantissa expresses the precision (how many decimal places, for example) of a number, and an exponent expresses the range of a number (such as, to what power of ten). For example, the number 5,280 can be represented in scientific notation for base 10 as $5.280 \times 10^3$, where 5.280 is the mantissa with four digits of precision, and 3 is the exponent, expressing a range from 1,000 up to, but not including, 10,000.

For a fixed point number, all of the bits representing the number are allocated to the mantissa, and none to the exponent. Thus, for a six-bit fixed point number, every whole number (sixty-four) in the range 0 to 63 can be represented. On the other hand, a floating point number allocates some bits to the mantissa and the remaining bits to the exponent, sacrificing precision for range. For example, a six-bit floating point number, allocating three bits to the mantissa and three bits to the exponent, can represent sixty-four whole numbers in the range 0 to 896 ($7 \times 2^7$).

Because floating point timers produce output bits for both the mantissa and the exponent, their internal circuitry is more complex, leading to difficulties in designing high resolution floating point timers using conventional circuits for generating the reference clock signal.

FIG. 1 illustrates an exemplary floating point timer using a conventional clock generation circuit, comprising a clock 100 and a divider 110. The clock 100 is typically implemented at a high-frequency crystal oscillator. Since the clock period of a high-frequency crystal oscillator is much faster than what the floating point counting circuits can handle, the crystal clock signal is divided down by divider 110 to produce a count signal as the reference clock signal.

At start time, the start signal is transmitted to reset the floating point counter logic. A mantissa counter 130 and an exponent counter 140 are set to zero, and a shift register 150 is loaded with a one ($2^0$), which loads a pre-scaler 120 with a scaling signal indicating a one. As count signals arrive from the divider 110, they are divided by the pre-scaler 120 to produce a scaled count signal, accounting for the exponent of the floating point counter. Initially, count signals result in a corresponding scaled count signal on a one-to-one basis.

Pre-scaler 120 can be implemented as a counter for providing a plurality of divided clock signals, each at a different frequency, which are applied to a multiplexer. The scaling signal is applied to the selection input of the multiplexer to select one of the divided clock frequencies as the scaled count signal.

The scaled count signal is used to increment the mantissa counter 130, of which the most significant is a sticky bit. Once the sticky bit is set, it remains set until explicitly reset. Thus, the sticky bit ceases to count after being set. The mantissa counter 130 outputs a mantissa signal M which is indicative of the mantissa of the floating point value of the floating point timer.

When the mantissa counter 130 overflows, it outputs an overflow count signal which increments the exponent counter 140 and shifts the shift register 150 one place to the left. Incrementing the exponent counter 140 results in incrementing exponent signal E, indicative of the exponent value of the floating point timer.

Shifting the shift register 150 to the left by one place causes a new scaling value of $2^E$ to be loaded into pre-scaler 120. Accordingly, pre-scaler 120 scales the subsequent count signal by the scaling value. For example, when the mantissa counter 130 overflows the first time after reset from the start signal, the shift register 150 contains a 2 ($2^{0+1}$) and outputs a scaling signal for a scaling value of 2 to pre-scaler 120. In response, pre-scaler 120 outputs a scaled count signal for every other count signal received.

When a stop signal is generated, an output latch 160 latches the mantissa signal M from the mantissa counter 130 and the exponent signal E from the exponent counter 140. The value latched in output latch 160 is a floating point number of the form $M \times 2^E$, representing a number of reference clock signals that have been generated in the interval of time between the start signal and the stop signal.

As mentioned earlier, the period of the reference clock signal cannot be shorter than what the floating point counting circuitry can handle, which is the worst case path through the floating point counter logic. In particular, the worst case path through the exemplary floating point counter of FIG. 1 occurs when the mantissa counter 130 overflows, causing the shift register 150 to be shifted one place to the left, outputting a new scaling signal to the pre-scaler 120. If the next count signal arrives at pre-scaler 120 before the new scaling signal in this situation, then the pre-scaler 120 is scaling the count signal by an incorrect amount.

With conventional reference clocks, the clock signal from clock 100 is divided with divider 110 by the greatest power of two so that the period of the resultant count signal is greater than the estimated worst-case delay path of the floating point counter logic. As a result, the resolution of such floating point timer can be up to half the theoretical limit, as determined by the worst-case delay path of the floating point counter logic.

DISCLOSURE OF THE INVENTION

There exists a need for a high-resolution floating pointer timer, preferably with reference clock circuitry that produces a reference clock signal that substantially matches the delay of the worst-case path through floating point counter logic.

This and other needs are met by the present invention, in which floating point timer comprises a floating point counter and a digital ring oscillator. The floating point counter is responsive to a start signal and a count signal and is configured for counting a number of occurrences of receiving the count signal since the start signal was received. The digital ring oscillator periodically outputs the count signal at an oscillation period that matches the delay of the worst case path of the floating point counter.

In one embodiment, the digital ring oscillator comprises a digital delay line for a delaying a bit for the oscillation period and outputting the count signal in accordance with the delayed bit. Detection logic coupled to the digital delay line outputs a busy signal that indicates whether or not a bit is being delayed by the digital delay line. Feedback logic is coupled to an output and input of the digital delay line and an output of the detection logic for reapplying a bit from the output of the digital delay line to be delayed by the digital delay line again.

Preferably, the digital delay lines comprises enough digital delay elements, each having an adjustable, consistent, short delay period around 140 ps, so that the oscillation period of the digital ring oscillator matches the delay of the worst case path through the floating point counter.

Additional objects, advantages, and novel features of the present invention will be set forth in part in the detailed description which follows, and in part will be come apparent upon examination or may be learned by practice of the invention. The objects and advantages of the invention may be realized and obtained by means of the instrumentalities and combinations particularly pointed out in the appended claims.

BRIEF DESCRIPTION OF DRAWINGS

The present invention is illustrated by way of example, and not by limitation, in the figures of the accompanying drawings, wherein elements having the same reference numeral designations represent like elements throughout and wherein.

BEST MODE FOR CARRYING OUT THE INVENTION

In the following description of a novel floating point timer, for purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Digital Ring Oscillator

Figure 1:
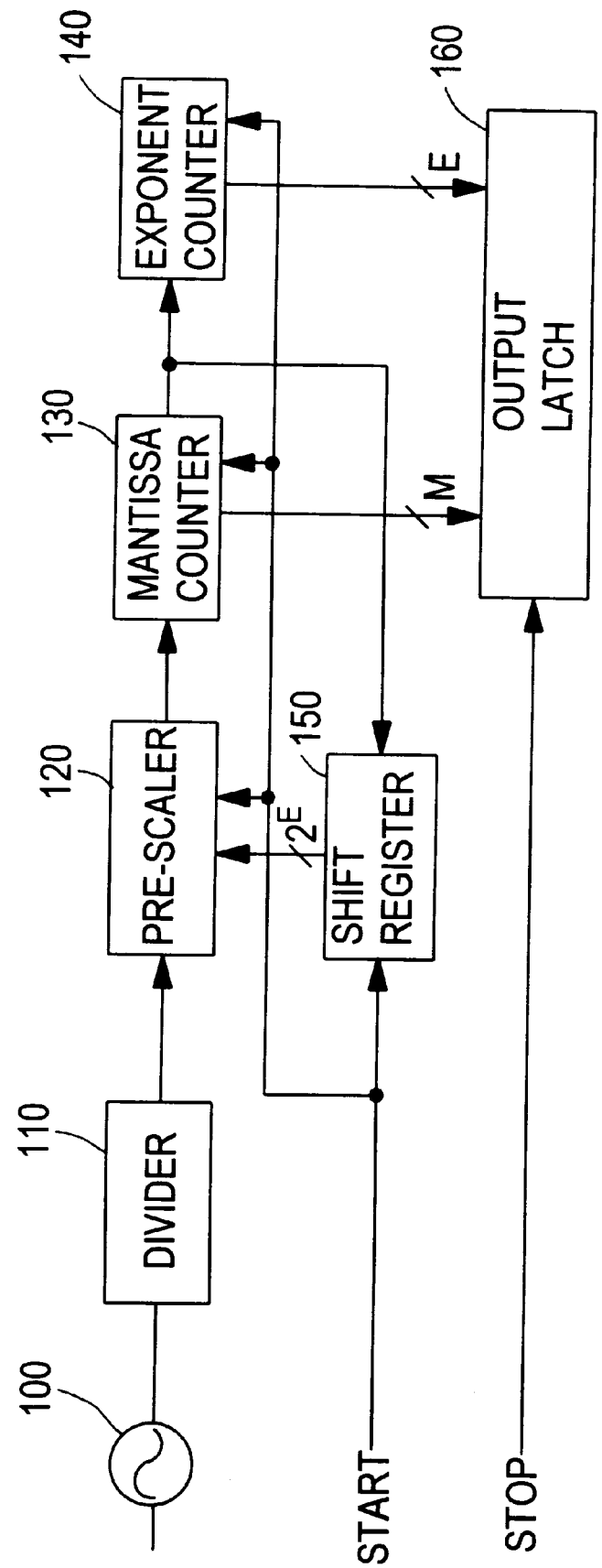
FIG. 1 is a block diagram of an exemplary floating point timer with a conventional count signal generation circuit.
Figure 2A:
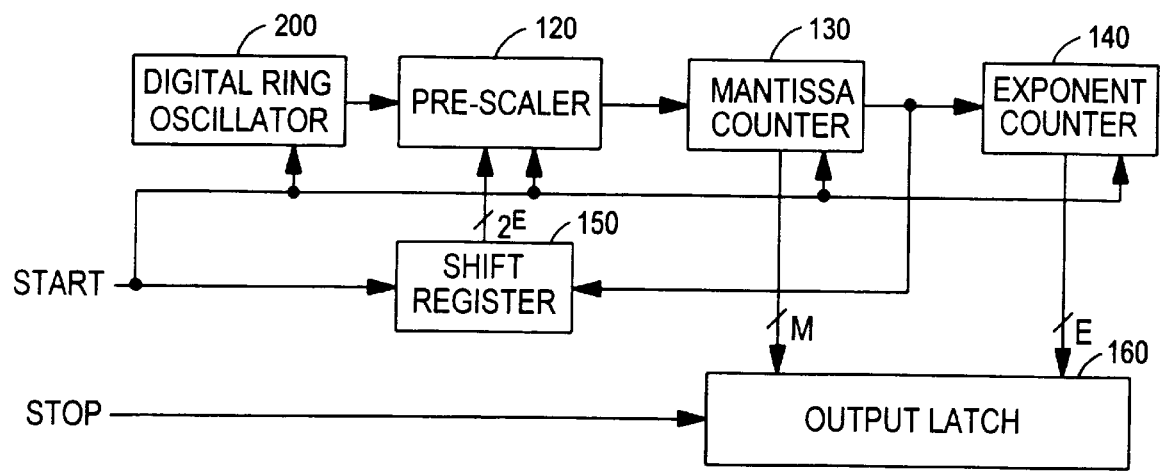
FIG. 2(a) is a block diagram of a floating point timer with a count signal generation circuit according to an embodiment of the invention.

Referring to FIG. 2(a), a floating point timer according to an embodiment of the present invention comprises a digital ring oscillator 200, which provides a count signal as a reference clock signal to the pre-scaler 120 of the floating point counter logic for the floating point timer. The elements 120 to 160 of the floating point counter and operation thereof are substantially the same as the elements and operation described with respect to the exemplary floating point counter of FIG. 1.

Figure 2B:
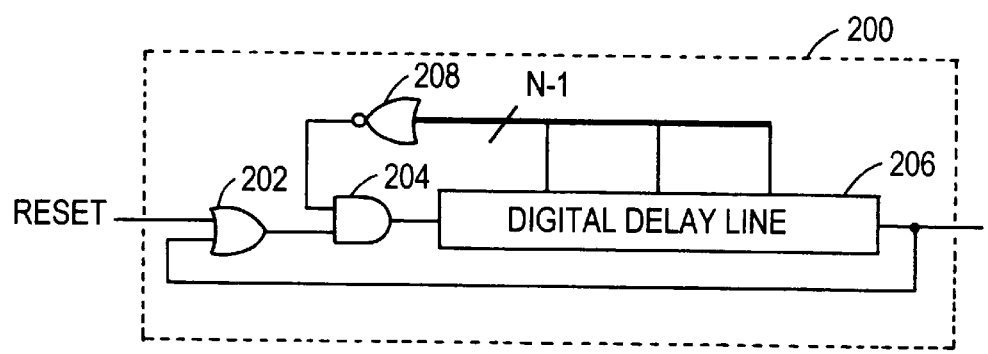
FIG. 2(b) is a block diagram of the count signal generation circuit of FIG. 2(a).

Digital ring oscillator 200, depicted in FIG. 2(b), is implemented to automatically, periodically output a count signal at an oscillation period that substantially matches the delay period of the worst case path through the floating point counter logic. Digital ring oscillator 200 comprises a digital delay line 206, which delays for a specified period a bit that was input. The delay period of the digital delay line 206 is configured to substantially match the delay period of the worst case path through the floating point counter logic. Implementation and operation of a digital delay line 206 with a series of delay elements are described in more detail hereinbelow.

A bit delayed by digital delay line 206 is fed back to the input of the digital delay line 206 through feedback logic, which in FIG. 2(b) comprises an OR gate 202 and an AND gate 204, to be reapplied to the input of the digital delay line 206. Thus, the output of digital delay line 206 is a periodic count signal with an oscillation period determined by the delay period of the digital delay line 206 and the feedback logic.

In order to start the ring oscillator, a reset input is coupled to the feedback logic to input a bit into the digital delay line 206. To avoid delaying more than one bit at time in the digital ring oscillator 200, detection logic, coupled to the digital delay line 206 and the feedback logic, determines whether or not a bit is being delayed by the digital delay line 206. If a bit is currently being delayed by the digital delay line 206, then new bits are prevented from being input into the digital delay line 206 until the bit being delayed appears at the output of the digital delay line 206.

According to one embodiment, digital delay line 206 comprises a series of delay elements, and hence the detection logic comprises a NOR gate 208 coupled to all but the last delay element in the digital delay line 206. The output of the NOR gate 208 is low when there is a bit in the digital delay line 206 and high when there is not such a bit. Thus, the output of the NOR gate 208 is coupled to the AND gate 204 for preventing a reset signal, passing through OR gate 202, from being applied to the digital delay line 206, when the digital delay line 206 is busy.

When power is first applied to the digital delay line 206, it is possible for delay elements of the digital delay line 206 to be in indeterminate states; hence there may be more than one bit delayed by the digital delay line 206, causing the ring oscillator 200 to output a count signal at irregular intervals.

However, the detection and feedback logic ensure that after one oscillation period, only one bit remains active in the ring oscillator 200, because the detection logic outputs the busy signal as long as there is a bit in the digital delay line 206. The busy signal is asserted until the last bit in the digital delay line 206 is output. Meanwhile, the assertion of the busy signal by the detection logic prevents any bit other than the last bit in the digital delay line 206 from being reapplied to the digital delay line 206.

On the other hand, if the digital delay line 206 is clear, then the cleared digital ring oscillator 200 will not output a count signal until a bit is input through the reset input. Coupling the reset input to receive the start signal for the floating point counter logic is one way to ensure that a cleared digital ring oscillator will start when the floating point timer is used.

Digital Delay Line

Figure 3A:
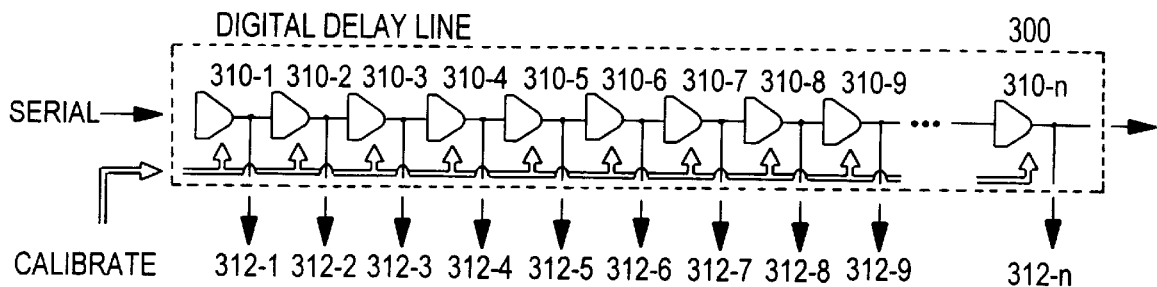
FIG. 3(a) is a block diagram of a digital delay line of FIG. 2(b) according to an embodiment.

FIG. 3(a) is a block diagram of an exemplary high-resolution, digital delay line 300 with which the present invention can be implemented. The exemplary high-resolution digital delay line 300 receives a bit and repeatedly delays the bit through a plurality of digital delay elements 310-1 to 310-n, coupled in series. Digital delay line 300 may comprise an arbitrary number n of digital delay elements, depending upon any constraints inherent in the semiconductor implementation utilized or other practical considerations. For example, digital delay line 300 can comprise tens of thousands of digital delay elements. Since each of the digital delay elements 310-1 to 310-n of digital delay line 300 is constructed during the same manufacturing process on the same semiconductor substrate, it is likely that the operating characteristics, and hence the delay period, of each digital delay element are nearly identical.

Outputs of a plurality of digital delay elements may be tapped to simultaneously monitor the digital delay elements for a delayed bit. Accordingly, digital delay line 300 comprises a plurality of taps 312-1 to 312-n coupled to the outputs of the respective digital delay elements 310-1 to 310-n for monitoring portions of the digital delay line 300 in parallel.

Delay characteristics of any digital circuit will vary from chip to chip and over time because of unavoidable variations in manufacturing and operating conditions. Thus, there is a need to calibrate the delay period of each of the digital delay elements 310-1 to 310-n to match a specified period. According to one approach, both the delay period is synchronized to a reliable, precise reference clock, such as a crystal oscillator.

The delay period of each of the digital delay elements 310-1 to 310-n is preferably adjustable by a digital command code as a calibration signal. This calibration signal is produced with reference to a reliable, precise clock signal, preferably by an on-chip digital servo circuit (not shown) such as described in the commonly assigned U.S. Pat. No. 5,457,719, issued to Guo et al. on Oct. 10, 1995. The on-chip digital servo circuit comprises an adjustable digital delay line of its own, which it monitors and continually adjusts with a calibration signal in a feedback loop. The calibration signal is shared with other systems on the chip.

Figure 3B:
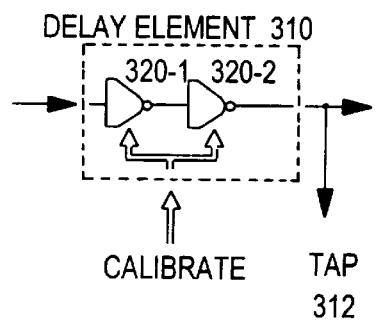
FIG. 3(b) is a block diagram of an adjustable delay element of the digital delay line of FIG. 3(a).

Referring to FIG. 3(b), each adjustable digital delay element 310 comprises two adjustable inverters 320-1 and 320-2, coupled in series, each receiving the aforementioned calibration signal. Thus, the delay period of each of the two adjustable inverters 320-1 and 320-2 is one-half of the delay period of the adjustable delay element and is controlled by the calibration signal.

Figure 3C:
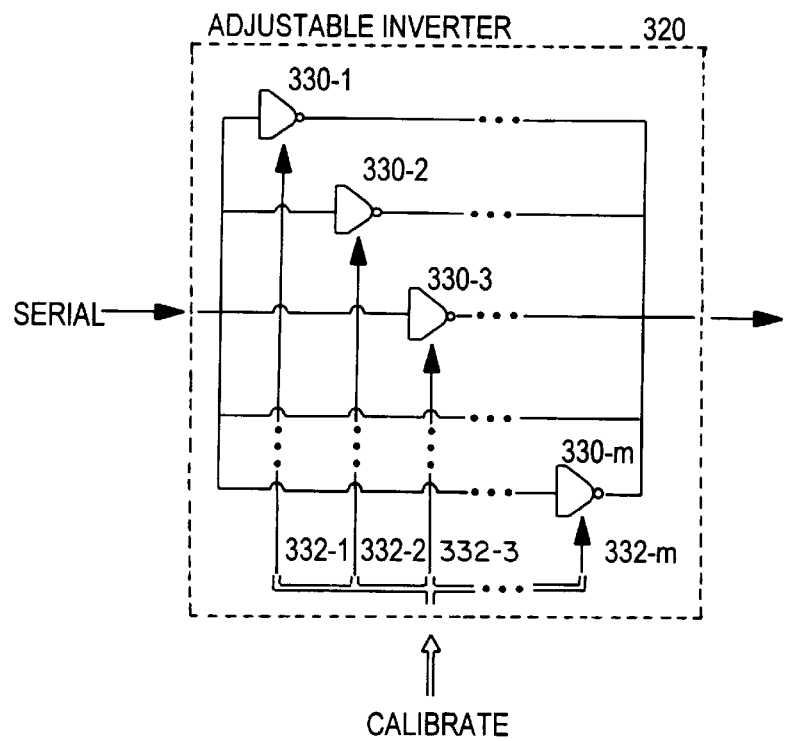
FIG. 3(c) is a block diagram of an adjustable inverter of the adjustable delay element of FIG. 3(b)

Referring to FIG. 3(c), each adjustable inverter 320 in a preferred embodiment comprises a plurality of switchable inverters 330-1 to 330-m coupled in parallel. Each of the switchable inverters 330-1 to 330-m is switched on or off by one of bits 332-1 to 332-m of the calibration signal. Thus, two of the parameters that determine the propagation delay of an inverter, the P-channel size to N-channel size ratio and the driving power, may be determined for precise control over the delay period. Switchable inverters are described in further detail in the commonly assigned U.S. Pat. No. 5,220,216, issued to Woo on Jun. 15, 1993, and the commonly assigned U.S. Pat. No. 5,227,679, issued to Woo on Jul. 13, 1993.

Accordingly, digital delay line 300 comprises a series of adjustable digital delay elements 310-1 to 310-n, each of which provides a uniform delay period synchronized to a reference clock period according to a calibration signal. Moreover, each adjustable inverter 320 can have a consistent delay period of as little as 70 ps. Thus, each adjustable digital delay element 310 can have a consistent delay period of as little as 140 ps.

The digital delay line 300 is implemented with enough adjustable digital delay elements of a particular delay period so that the total delay period exceeds the delay time of the worst case path through the floating point counter logic. For example, if the delay time of the worst case path through the floating point counter logic is 30 ns, then a minimum of 215 (30 ns/140 ps=214.3 rounded up) adjustable delay elements having a 140 ps delay period is required.

The number of adjustable, delay elements can be reduced by using adjustable delay elements with a larger period. In fact, adjustable delay element having different periods may be used, for example twenty with a delay period of 1.4 ns and fifteen with a delay period of 140 ps.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A floating point timer comprising:

a floating point counter responsive to a start signal and a count signal for counting a number of occurrences of receiving the count signal since the start signal was received; and a digital ring oscillator for periodically outputting the count signal at an oscillation period that matches the delay of the worst case path of said floating point counter.

2. The floating point timer of claim 1, wherein said digital ring oscillator comprises:

a digital delay line for delaying a bit for the oscillation period and thereupon outputting the count signal;

detection logic coupled to said digital delay line and configured for outputting a busy signal indicative of whether or not a bit is being delayed by said digital delay line; and feedback logic coupled to an output of said digital delay line, an input of said digital delay line, and an output of said detection logic and configured for applying a bit to be delayed by said digital delay line responsive to the busy signal, the count signal, and the start signal.

3. The floating pointer timer of claim 1, wherein:

said digital delay line includes a plurality 'n' of digital delay elements coupled in series for successively delaying the bit;

said detection logic includes a NOR gate having inputs coupled to outputs of the first 'n−1' digital delay elements;

said feedback logic includes an OR gate having inputs coupled to an output of the 'n'th digital delay element and a conductor carrying the start signal, and an AND gate having inputs coupled to an output of the NOR gate and an output of the OR gate; and an input of the first of said plurality of digital delay elements is coupled to an output of the AND gate.

4. The floating point timer of claim 3, wherein each of said plurality of digital delay elements has a delay period of about 140 ps.

5. The floating point timer of claim 3, wherein each of said plurality of digital delay elements includes a calibration input for receiving a calibration signal for adjusting the delay period thereof.

6. The floating point timer of claim 1, wherein said floating point counter comprises:

a pre-scaler for outputting a scaled count signal based on the count signal and a scaling signal;

a mantissa counter for counting occurrences of the scaled count signal and outputting an overflow count signal;

an exponent counter for counting occurrences of the overflow count signal; and a shift register for doubling the scaling signal in response to the overflow count signal.

7. A floating point timer responsive to a start signal, comprising:

a digital delay line for delaying a bit for an oscillation period and thereupon outputting a count signal;

detection logic coupled to said digital delay line and configured for outputting a busy signal indicative of whether or not a bit is being delayed by said digital delay line;

feedback logic coupled to an output of said digital delay line, an input of said digital delay line, and an output of said detection logic and configured for applying a bit to be delayed by said digital delay line responsive to the busy signal, the count signal, and the start signal;

a pre-scaler for outputting a scaled count signal based on the count signal and a scaling signal, wherein said prescaler is set to a prescribed logic in response to the start signal;

a mantissa counter for counting occurrences of the scaled count signal and outputting an overflow count signal, wherein said mantissa counter is reset to a complementary logic state in response to the start signal;

an exponent counter for counting occurrences of the overflow count signal, wherein said mantissa counter is reset to the complementary logic state in response to the start signal; and a shift register for doubling the scaling signal in response to the overflow count signal, wherein said prescaler is set to the prescribed logic state in response to the start signal;

wherein the oscillation period substantially matches the delay period of a path through said pre-scaler to said mantissa counter to said shift register and back to said pre-scaler.

* * * * *